United States Patent [19]

Aoyama et al.

[11] Patent Number: 5,350,921
[45] Date of Patent: Sep. 27, 1994

[54] ANALYTICAL ELECTRON MICROSCOPE AND A METHOD OF OPERATING SUCH AN ELECTRON MICROSCOPE

[75] Inventors: Takashi Aoyama, Tokai; Yutaka Misawa, Katsuta, both of Japan

[73] Assignee: Hitachi, Ltd., Tokyo, Japan

[21] Appl. No.: 94,955

[22] Filed: Jul. 23, 1993

[30] Foreign Application Priority Data

Jul. 29, 1992 [JP] Japan .................. 4-202314

[51] Int. Cl.$^5$ .................. H01J 37/26; G01N 23/00
[52] U.S. Cl. .................. 250/311; 250/310; 250/307
[58] Field of Search .................. 250/307, 310, 311

[56] References Cited

U.S. PATENT DOCUMENTS

| | | | |
|---|---|---|---|
| 4,851,674 | 7/1989 | Kobayashi | 250/311 |
| 5,001,350 | 3/1991 | Ohi et al. | 250/440.11 |
| 5,065,020 | 11/1991 | Kanda | 250/310 |
| 5,084,618 | 1/1992 | Ito | 250/307 |
| 5,118,941 | 6/1992 | Larson | 250/310 |
| 5,144,129 | 9/1992 | Kobayashi | 250/307 |

FOREIGN PATENT DOCUMENTS

| | | |
|---|---|---|
| 0409209 | 1/1991 | European Pat. Off. |
| 56-7338 | 1/1981 | Japan . |
| 3-152846 | 6/1991 | Japan . |
| 3-194839 | 8/1991 | Japan . |

OTHER PUBLICATIONS

Schneider et al., *Measurement Science and Technology*, vol. 1, No. 9, Sep. 1990, pp. 887–893.

*Primary Examiner*—Jack I. Berman
*Attorney, Agent, or Firm*—Antonelli, Terry, Stout & Kraus

[57] ABSTRACT

An analytical electron microscope automatically identifies objects in a sample on the basis of shape of the object, change of thickness of the object and/or change of element (such as change of element type or concentration). Therefore, the operator of the analytical electron microscope can specify a desired object, and an example or examples of that object in a sample can be identified automatically. The characteristics need to identify the object are determined by detecting the effect of the sample on the electron beam of the analytical electron microscope, using, for example, an energy dispersive type X-ray analyzer and an electron energy loss spectrometer. Once an example of the object has been identified, it may be analyzed further. The analytical electron microscope may also analyze a sample to identify and classify the objects present.

26 Claims, 9 Drawing Sheets

FIG. 2

| | Object | Shape | Film thickness | Element | Code |
|---|---|---|---|---|---|
| 1 | Dissimilar material | Line (Linear or curved) (1) | Stepwise ⌐ (1) | Stepwise ⌐ (2) | 1-1-2 |
| 2 | Dissimilar interface | | | Plane (1) | 1-1-1 |
| 3 | Dislocation | | Concave ∨ (2) | Plane (1) | 1-2-1 |
| 4 | Grain boundary | | | Convex ∧ (3) | 1-2-3 |
| 5 | Edge portions | | Half-plane (3) | Half-plane (4) | 1-3-4 |
| 6 | Precipitation | Closed system (Circle or polygon) (2) | Convex ∧ (4) | Convex ∧ (3) | 2-4-3 |
| 7 | Protrusion | | | Plane (1) | 2-4-1 |
| 8 | Pit | | Concave ∨ (2) | (1) | 2-2-1 |
| 9 | Crystalline lattice | Lattice (3) | Plane (5) | Plane (1) | 3-5-1 |
| 10 | Super-lattice | | | Cyclic lattice (5) | 3-5-5 |
| 11 | Lamination defect | | Concave ∨ (2) | Plane (1) | 3-2-1 |
| 12 | Moire | Distorted (4) | Plane (5) | Plane (1) | 4-5-1 |
| 13 | Amorphous | Mottle (5) | Plane | Plane | 5-5-1 |
| 14 | Inclusive of crystal & amorphous | Lattice + mottle (6) | (5) | (1) | 6-5-1 |

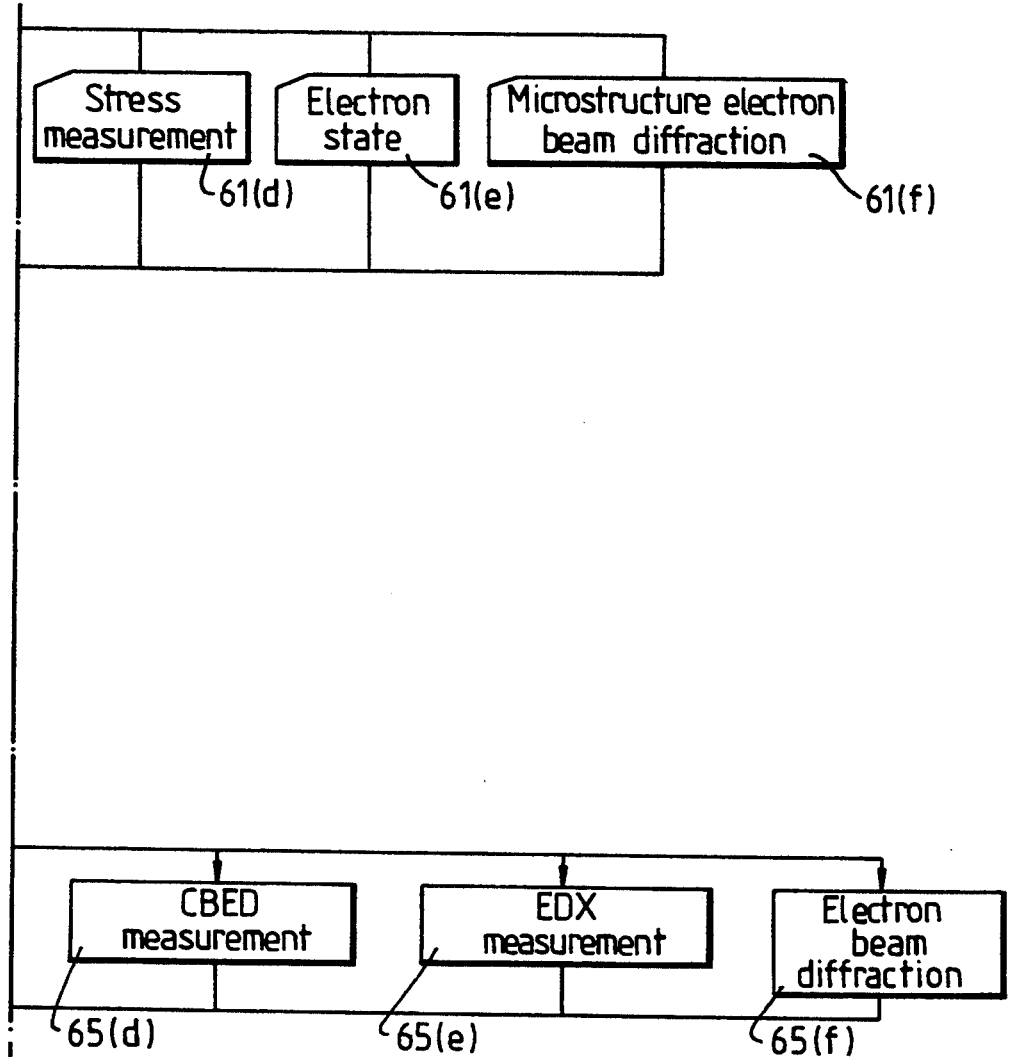

ANALYTICAL ELECTRON MICROSCOPE AND A METHOD OF OPERATING SUCH AN ELECTRON MICROSCOPE

BACKGROUND OF THE INVENTION

1. Field of the Invention

The present invention relates to an analytical electron microscope. It also relates to a method of operating such an electron microscope.

2. Summary of the Prior Art

In an analytical electron microscope, an electron beam is generated and caused to be incident on a sample to be investigated. The beam is controlled and focused by suitable electron lenses. There are several types of analyzers that may then be used in conjunction with the analytical electron microscope to determine the effect of the sample on the electron beam. Since an analytic electron microscope operates by transmission, it is possible to determine the energy loss of electrons of the beam which interact with the sample, using a detecting device known as an electron energy loss spectrometer (EELS). Also known is a detecting device known as an energy dispersive X-ray analyzer (EDX) which detects the element or elements present in the sample to be determined. The electron microscope can be operated to various configuration, so that it acts as a convergent electron beam diffraction device, (CBED). This permits the shape (i.e. surface configuration) of the sample to be detected.

Proposals have been made to automate control of the incidence of the electron beam on the sample. For example, automatic control of axial alignment, astigmatic adjustment and focusing have been automated. Examples of such automation are disclosed in JP-B-A-56-7338, JP-A-58-19423, JP-A-3-152846, JP-A-3-194839 and U.S. Pat. No. 4,871,912.

However, the subsequent analysis in known systems depends on the skill of the operator. The output of the various detecting devices that may be used, e.g. EDX, EELS or CBED, are displayed on a suitable display. When an object, such as a dislocation or grain boundary is present within the object, the operator can detect the presence and the type of such an object on the basis of experience, since each object will produce a different effect in one or more of the detectors. However, a high level of skill is required if the operator is successfully to distinguish the many types of objects that may be present in the sample.

SUMMARY OF THE PRESENT INVENTION

It has been realized that each of the different types of objects that may be present in a sample have different characteristics of shape, thickness and of elements presence. Therefore, by considering these characteristics, it becomes possible to determine the type of object detected.

Thus, although an interface between dissimilar materials and a dislocation can both be considered linear objects in the sample, so had similar shaped characteristics, the interface between dissimilar materials will usually correspond to a step line change in thickness and a step line change in elements (both materials are dissimilar). On the other hand, a dislocation will have a depression (concavity) in its film thickness but will have the same elements across the object (which thus can be considered planer element characteristics), so that the two different objects can be distinguished. Other objects, such as a pit, will have different shape characteristics. Indeed, some objects can be distinguished because one of their shape, film thickness, and elements is unique to the particular object.

Thus, in the first aspect of the present invention, the invention proposes that a sample be investigated by an electron beam of an analytical electron microscope and the shape, thickness and elements of the objects in the sample be investigated automatically, so that they may be classified into groups corresponding to the different types of objects present. Of course, if there was only one object present, or all the objects were of the same type, then this aspect of the present invention would then identify the object type.

Such classification or identification of objects automatically has not been considered in the prior art, but it has been further realized that the fact that the objects can be recognized permits a more practically useful analysis technique, which forms the basis of the second aspect of the present invention. In the second aspect, the operator of the analytically analytical electron microscope specifies the type of object to be investigated (that specified object being referred to herein as the "desired object"). The analytical electron microscope may then investigate the sample automatically and identify whether any of the objects present in the sample, (hereinafter "detected objects") corresponds to the desired object.

Thus, this aspect of the present invention makes it possible for the user to investigate particular types of objects within a sample rapidly, since the scanning electron microscope can automatically identify those objects within the sample. Such automatic identification of particular types of objects has never been possible in the prior art, since identification of the objects depended on the skill and knowledge of the operator.

As has been mentioned above, both of these aspects of the present invention depend on automatic identification of the shape, thickness and/or elements of an object present in a sample. In order to identify the shape, the analytical electron microscope may be configured as a converged electron beam diffraction device (CEBD). This allows the shape to be identified. In order to determine the changes of thickness of the object, an electron energy loss spectrometer device (EELS) may be used, and in order to determine the element or elements present in the sample, an energy dispersive type X-ray analyzer device (EDX), may be used. Although, each of CEBD, EELS and EDX devices have been used in prior art analytical electron microscopes, they have previously been used only to provide information to an operator, rather than provide automatic analysis.

Once objects have been identified or classified automatically, it is then possible to carry out a more detailed investigation of one or more of the detected objects. This therefore represents a third aspect of the present invention. In that third aspect, it is possible for the user to specify a desired object, and for the automatic investigation to investigate one or more of the detected objects which corresponds to the desired object. Alternatively, where the analytical electron microscope classifies detected objects into classes (types) depending on object type, it is then possible to investigate in more detail at least one detected object of at least one of the classes.

It should be noted that the present invention relates to both an analytical electron microscope incorporating any or all of the above aspects of the present invention and to a method of operating an analytical electron microscope according to any or all of the above aspects of the present invention.

BRIEF DESCRIPTION OF THE DRAWINGS

Embodiments of the present invention will now be described in detail, by way of example, with reference to the accompanying drawings, in which:

FIG. 2 illustrates, in tabular form, the characteristics of types of objects which may be analyzed according to the present invention;

DETAILED DESCRIPTION

General Principles

Before embodiments of the present invention are discussed in detail, the General principals of detection of objects in a sample will be described. In order to identify the objects, it is necessary to have detectors which detect the shape of the object in the sample, detect any changes in thickness of the object of the sample, (which changes are normally detected by detecting changes in the surface of the sample), and to detect any changes (e.g. type or concentration) of the chemical element or elements forming the sample at the object. In general, the shape may be identified by a convergent electron beam diffraction device ( CBED ), the thickness by an electron energy loss spectrometer (EELS), and changes in element or elements by an energy dispersive X-ray analyzer (EDX).

Figure 1:
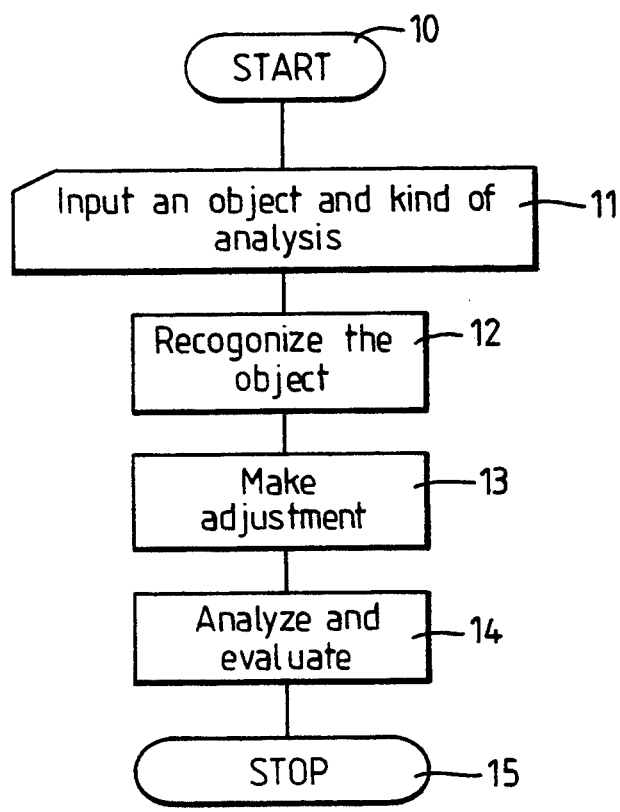
FIG. 1 is a flowchart illustrating the fundamental steps in a method of operating an analytical electron microscope according to the present invention.

FIG. 1 then illustrates the fundamental steps in carrying out analysis according to embodiments of the present invention. The process is started (step 10) and the operator then selects a specific object to be evaluated, and may also specify the kind of analysis to be carried out on that object (step 11). The type of objects and the kinds of analysis that may be carried out by any given apparatus may be predetermined, so that the user selects the object and the kind of analysis from a pre-set list. A suitable terminal may be provided to permit the operator to input such information.

Once the object and the kind of analysis is specified, the sample is investigated until an object of the specified type is recognized (step 12), the operation of the analytical electron microscope may be controlled automatically by suitable information stored in the memory of a processor (CPU).

Once the object has been recognized, adjustments are made (step 13) to change the measuring position, tilt angle (orientation) of the sample, and to change the magnification and/or size of the beam to carry out the specified kind of analysis. The appropriate analysis and evaluation of the object can then be carried out (step 14). Once that analysis and evaluation has occurred, the automatic operation then stops. (step 15). The results may then be displayed or printed for checking by the operator, so that the operator can carry out further corrections if necessary.

As discussed above, the present invention is based on the realization that different objects can be distinguished by determining one or more of the object shape, change of thickness and change of element. FIG. 2 illustrates the shape, change in film thickness and changes in element for the different objects that may be present in a sample.

In FIG. 2, the term "stepwise" referring to changes of film thickness and element means that the object exhibits a discontinuity in thickness and/or element across the object. This is contrasted with the term "plane" which means that the thickness and/or elements do not change across the sample. In some cases, the film thickness decreases and then returns to its original value across the sample, and this is referred to in FIG. 2 as a "concave" arrangement. Similarly, there are arrangements (referred to as "convex" in which the film thickness increases and then returns to its original value. In a similar way, there are objects for which an element (e.g. a doping element) exhibits a change within the object in which the concentration of the element is increases and decreases, and this is referred to as a "convex" change in the elements. Finally, the edge of the sample can be detected as a break in the thickness and element, and this is referred to as a "half-plane" change.

Thus, it can be seen from FIG. 2, that each object can be identified by a unique code corresponding to the shape, change of thickness, and change of an element or elements. In the case of moire or amorphous objects, the shape of the object is unique to that object, and thus these objects can be distinguished solely from identification of the shape. In other cases, as can be seen from FIG. 2, it is necessary to consider two or even three of the characteristics of shape, thickness and element, in order to identify the object.

The identification and analysis of objects will now be described in more detail.

When it is desired to measure the concentration distribution of an impurity in the vicinity of a grain boundary, for example, in a polycrystalline silicon, the first step is to carry out a preliminary analysis is conducted as follows. First, the position of the objects which have a shape linear are detected. Then, the film thickness of the objects is investigated in a direction transverse to the linear object. The measurement of film thickness may be carried out by a known method (for example, the film thickness t is obtained from the intensity I(O) of a transmitted electron beam in the EELS and from the intensity Ip due to absorption of plasma such that $t=\ln(Ip/IO)L$ (where, L represents a mean free path specific to the material). Objects are then selected which have a concave portion in the film thickness distribution.

Then, with an EDX detector, the selected objects are scanned in the same direction as for the film thickness measurement to conduct element analysis. As the result of that analysis an object is selected where silicon, which is an element constituting the matrix is most depleted along a line and the impurity concentration has a increase. The object is then identified as a grain boundary. When a grain boundary is detected as above, the position and the direction of the grain boundary may be stored in a suitable memory. This enables confirmation of the crystalline boundary by observation of different parts of that boundary having a different direction in the crystalline lattice in two different regions intersecting the line of first measurement.

Thus, the position and direction of an object to be analyzed (in the above example, a grain boundary and the direction of the boundary). By repeating this process, the number of said items measurable (recognizable) in the specimen can be determined.

Next, an adjustment method for correctly adjusting the analytical electron microscope (step 13 in FIG. 1) by way of preparation for the analysis step (step 14) will be explained below. Once the position of an object is determined as discussed above, the objects can be readily be moved to the center of the viewing field of the transmission electron microscope, said movement being controlled by a suitable processor (CPU). In order to orient the direction of e.g the grain boundary parallel to the incident electron beam, a method for rotating and tilting the specimen so as to orient the same in a predetermined direction will now be described.

Figure 3:
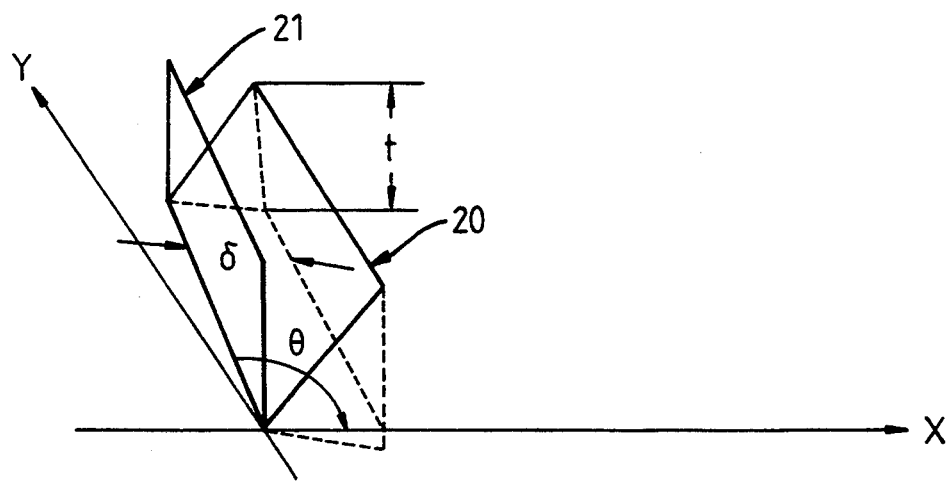
FIG. 3 shows the rotation of a crystalline grain boundary of a specimen, for analysis according to the present invention.

FIG. 3 is a schematic diagram illustrating method for orientating a crystalline grain boundary in an analytical region with a predetermined plane and calculating the tilt angle thereof. Assuming that the apparent grain boundary width is δ, the apparent film thickness is t, the angle formed between the intersection of the grain boundary with the x-y plane and the x-axis is θ, and the angle formed between the grain boundary plane and the incident electron beam is γ, then γ is $\arctan(\delta/t)$. Then, when the initial grain boundary plane 20 is rotated with respect to the x and y axes by rotation angles α and β which are obtained by distributing γ to the x and y axes respectively, calculated as $\alpha=\cos\theta\cdot\arctan(\delta/t)$ and $\beta=\sin\theta\cdot\arctan(\delta/t)$, the grain boundary plane can be moved to a position 21 substantially parallel to the incident electron beam. These operations may be performed under control of a suitable processor.

By measuring δ again after rotation as discussed above, the rotation operation with respect to the x and y axes can be repeated in the same manner as above until δ is minimized. Hence, the grain boundary plane may be made substantially parallel to the incident electron beam with a high precision. The final value of δ can be considered to correspond to the true grain boundary width.

Using the value of δ thus obtained, a magnification M suitable for analytical evaluation may be chosen so that it has a suitable value according to $M=C1/\delta$ (where $C1=0.01\sim0.001$ m). The diameter d of the electron beam suitable for analysis of the element can be determined according to $d=\delta/C2$ (where, $C2=3\sim5$).

Figure 4:
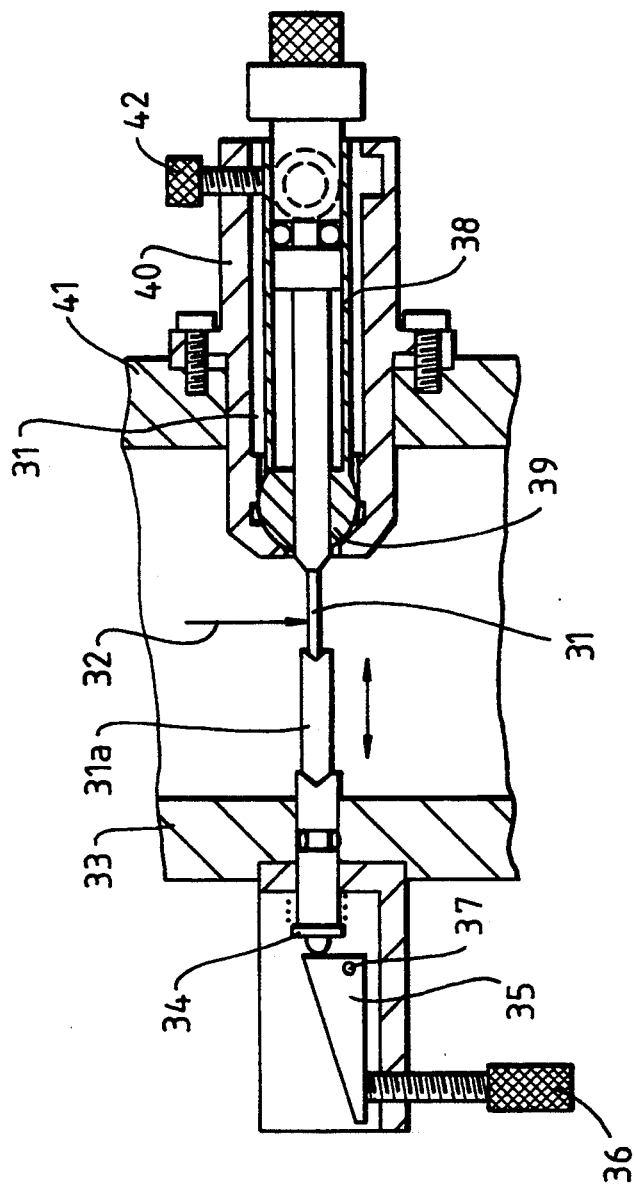
FIG. 4 shows an arrangement for moving specimen in an analytical electron microscope.

FIG. 4 illustrates an arrangement for moving a sample in an electron microscope. FIG. 4 illustrates movement in, and rotation about, one axis (the X axis), but known arrangements may also be provided for movement in, and rotation about, a perpendicular axis (the Y axis). In FIG. 4, a sample 31 is held between holders 31a, 31b in the path of an electron beam 32. To move the sample 31 in the X axis, the holder 31a extends through a wall 33 to a stop 34. That stop 34 abuts a triangular plate 35, so that one surface of that triangular plate 35 abuts the stop 34 and a perpendicular surface abuts a threaded shaft 36. By moving the threaded shaft 36, the triangular plate 35 is pivoted about an axis 36, thereby moving the holder 31a. Of course, corresponding movement of the other holder 31b is also required.

As can be seen from FIG. 4, the holder 31b extends into a cylinder 38 which terminates in a ball 39 in a hollow projection 40 which projects from another wall 41 of the electron microscope. Normally, the tube 38 is held in the projection 40 by a gripping means 42, but that gripping means may be released to permit rotation of the tube 38 in the projection 40, thereby rotating the holder 31b about the X axis.

Thus, by controlling the shaft 36 and tube 38 by a suitable processor, automatic operation can be achieved.

It should be noted that, by suitable control of the electron beam 32, it is also possible to move the electron beam 32 relative to the sample 31. However, it is generally more satisfactory to move the sample.

In order to obtain the concentration distribution of element or elements in the vicinity of the grain boundary, the electron beam is fixed in a central position within the electron microscope equipment. Then the specimen is moved in a sequence of steps to that central position. During that movement the concentration distribution at a sequence of points of measurement may be determined. The concentration of an element or elements may be obtained by measuring characteristic X-rays generated in a region irradiated with electron beams by means of an EDX detector. The positions of the respective measuring points are preferably set perpendicular to the grain boundary, so that they are 0, ±d, ±2d, ±3d, ±5d, ±7d and ±10d about the center of the grain boundary.

Because the plane of a specimen is usually tilted, it is necessary to make a focal correction prior to starting the next measurement when the specimen is moved. The amount of correction Δz for this focal correction is given by $\Delta z=\Delta x\beta+\Delta y\alpha$ (where, Δx and Δy are the shifts in X and Y axes) by approximating the specimen to a plane. When the measuring position is changed, this correction is calculated by the CPU, and a corresponding focal correction is made. The result of measurement after correction is output, for example, by a printer or a CRT display.

The analytical evaluation includes image observation using the transmission electron microscope, microstructure electron beam diffraction, analysis of the element or elements, lattice spacing (stress) measurement, and electron-state measurement.

Specimens suitable for measurement according to the invention, include a foiled specimen of e.g. metal or semiconductor prepared for observation by a transmission electron microscope. In particular, it is desirable to employ a specimen which is machined with an ion beam or laser which has been described in the JP-A-4-88908.

The use of such machining has the advantage that there is no damage to the region.

Reference has been made above to converged electron beam diffraction. This requires electron beams to be irradiated over a specimen at a greater angle (approximately at 10 mrad) to obtain diffraction lines from a crystalline plane of a higher order, instead of a spot pattern obtained in standard electron diffraction. Then, from the spacing between these diffraction lines, a lattice spacing or stress which caused a change in the lattice spacing can be measured with a high precision (with an error of about $10^{-4}$).

The present invention provides the advantage that no particularly skill or experience are needed in order to operate the analytical electron microscope. Furthermore, the measuring precision is substantially improved and the measuring time shortened.

Having discussed the general principals of the present invention, specific embodiments of the present invention will now be discussed.

Embodiment 1

Figure 5:
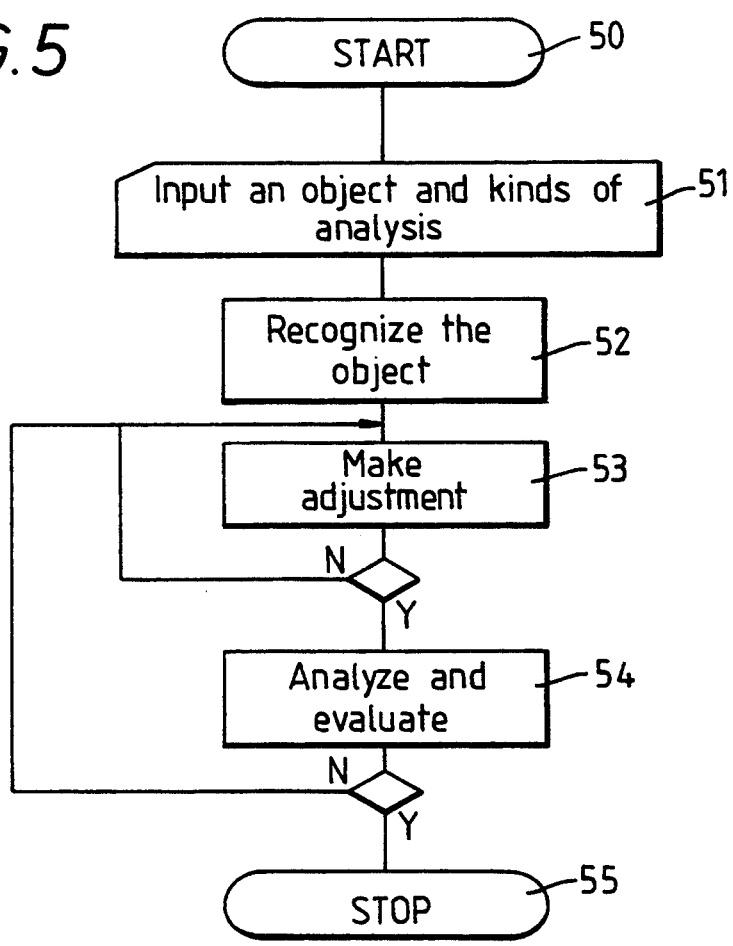
FIG. 5 is a flowchart showing the basic steps of a method of operating an analytical electron microscope according to a first embodiment of the present invention.
Figure 6:
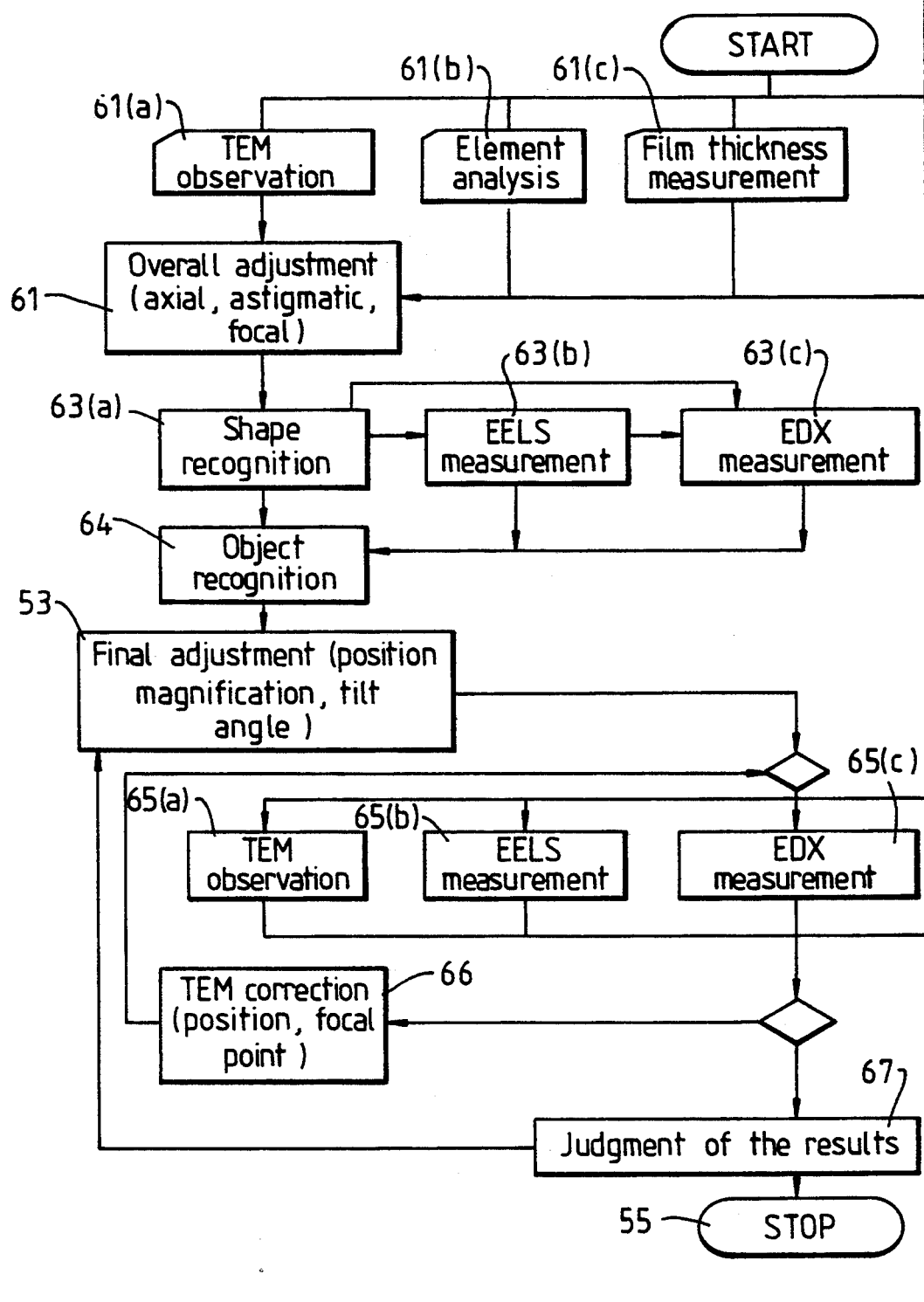
FIG. 6 shows in more detail the steps of the method of the first embodiment.
Figure 7:
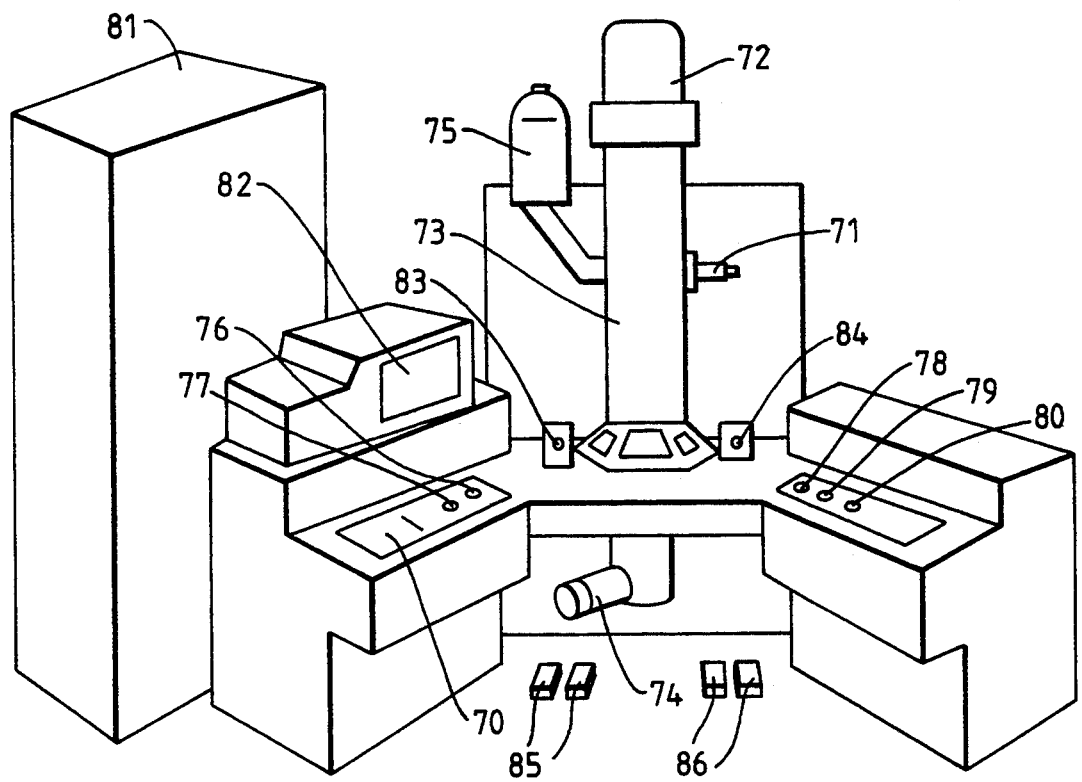
FIG. 7 shows an analytical electron microscope used in the first embodiment.

One embodiment of the invention will now be described, by way of example, illustrating the measurement of the concentration distribution of phosphorus (P) in the vicinity of a grain boundary in a polycrystalline silicon. FIG. 5 shows a flowchart of this embodiment, and FIG. 6 shows the content of the flowchart of FIG. 5 in more detail. FIG. 7 is a perspective view of the general construction of an automated analytical electron microscope which can be used in this embodiment.

After the start, the operator enters (step 51) from a terminal 70 (FIG. 7) the object "grain boundary vicinity" to be detected in polycrystalline silicon sample, and the analysis "element analysis" of an impurity element which is the kind of analysis to be carried out. It can be seen from FIG. 6 that "element analysis is one of a plurality of kinds of analysis 61(a) to 61(b) that may be specified by the operator.

Then, when a specimen to be measured is mounted on a specimen holder 71 and inserted into an analytical electron microscope. The analytical electron microscope has an electron gun 72 for generating an electron beam (the electron beam 32 shown in FIG. 4), which electron beam passes down a mirror tube 73 through the specimen holder 71. An electron energy loss spectrometer (EELS) 74, is located on the opposite side of the specimen holder 71 from the electron gun 72 and X-ray generated from the sample in the specimen holder 71 are detected by an X-ray detector (EDX) 75.

FIG. 7 also shows the controls of the analytical electron microscope. In addition to the terminal 70, there is a control knob 76 for controlling manually the electron beam diameter, (a control knob 77 for controlling manually the magnification of the analytical electron microscope) a knob 78 for controlling manually the focal point of the electron beam generated from the electron gun 72 and knobs 79, 80 for controlling manually the position of the electron beam in the X and Y axis respectively. The operation of the analytical electron microscope is controlled by a processor (CPU) 81, and the results of the investigation can be displayed on a display screen 82. Knobs 83 and 84 are for shifting the specimen and foot pedals 85, 86 are for changing the orientation of the specimen.

When the sample is inserted into the analytical electron microscope, the analytical electron microscope must then be adjusted (step 62) in FIG. 6 in which axial astigmatic, and focal adjustments are made. Then, as shown in FIG. 5, the microscope enters into an automatic object recognition operation 52, which is preset in the memory of the processor (CPU) 81. As shown in FIG. 2, recognition of the shape of the object is necessary. In this embodiment of the invention, a voltage of 200 kV which is the maximum acceleration voltage allowed and an electron current of 25 μA are set automatically. There is normally a hole in the central portion of the specimen where the transmissivity of electron beam is then maximum. This hole is therefore located first. Then, observation starts as programmed in the memory of the CPU 81 from the vicinity of the hole (this corresponds, in the case of manual operation, to a locating operation by the operator for searching for hole provided in the center of the specimen by controlling specimen shifting knobs 83, 84).

Shape recognition is performed as follows. The magnification of measurement is increased stepwise, starting from 2,000 to 5,000, 10,000, 40,000, 100,000, 200,000, 500,000 automatically in sequence (this corresponds, in manual operation, to increase in the magnification operator using the magnification knob 77). Recognition of the shape of an object (step 63(a)) in FIG. 6 can then be carried out by measurement of the intensity distribution of transmitted electron beams and image processing thereof.

Figure 8A:
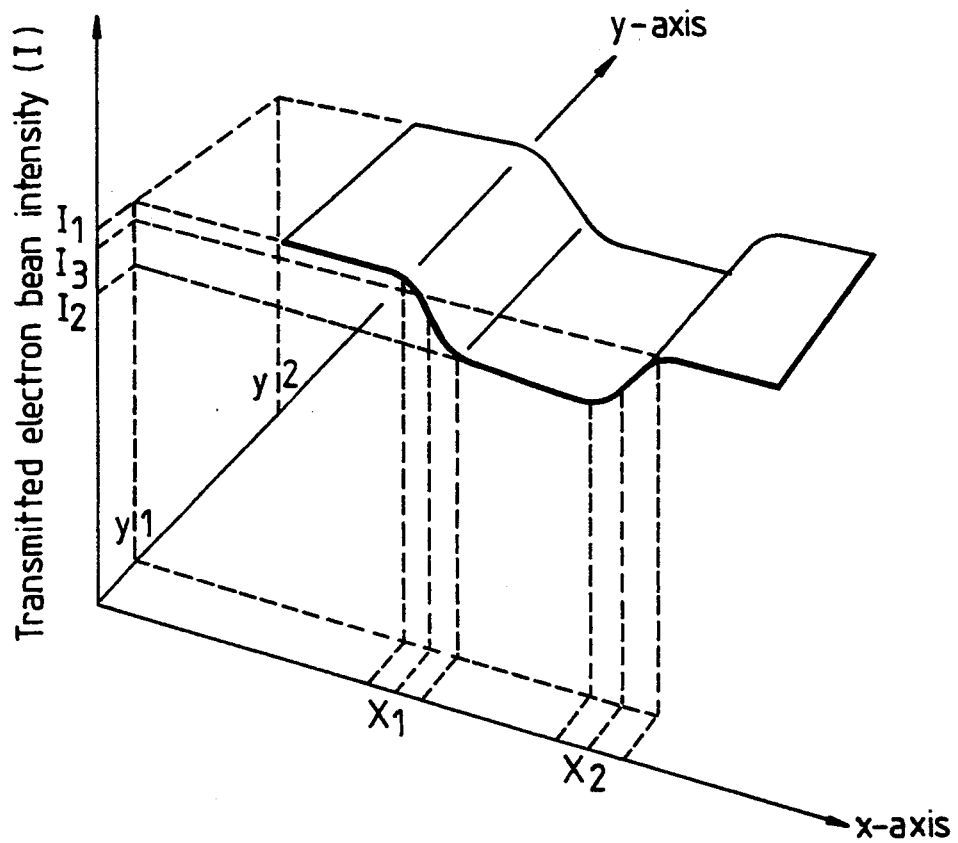
FIG. 8(a) and 8(b) illustrate intensity distributions of the electron beam of an analytical electron microscope.
Figure 8B:
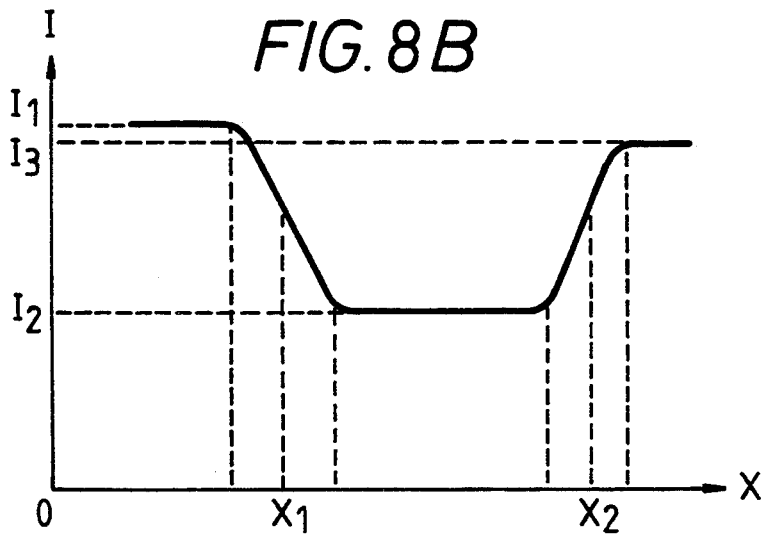

FIG. 8(a) and 8(b) show an example of the intensity distribution of a transmitted electron beam. This illustrates the case, for measuring a "grain boundary", of determining the position, length and width thereof (in order to simplify the explanation, the "grain boundary" is represented by a linear line parallel to the y-axis). The transmitted electron beam intensity in the x-axial direction decreases from $I_1$ to $I_2$, then again increases to $I_3$. When the decrease from $I_1$ to $I_2$ is 20% or more than the intensity of $I_1$, namely, when $(I_1-I_2)/I_1 \geq 0.2$, it is considered that a significant difference is present ($I_1$ and $I_2$ are assumed to be different).

Likewise, when an intensity $I_3$ does not differ by more than 20% from the intensity $I_1$, $I_1$ and $I_3$ are assumed to be substantially equal. When the width of the grain boundary is assumed to be a distance $\sigma(\sigma=x_2-x_1)$ corresponding to between $(I_1+I_2)/2$ and $(I_2+I_3)/2$ of the intensity of the transmitted electron beams, the length of the grain boundary 1 is given by $y_2-y_1$, and the position of the grain boundary is determined by $x=(x_1+x_2)/2$, $y_1 \leq y \leq y_2$.

Unless the change in the intensity $I_2$ of the transmitted electron beam does not exceed 20% of $I_1$ it is presumed to be within the same grain boundary. If the change in the intensity $I_2$ does not exceed 20%, but when the grain boundary has a branch (triple point), or intersects with another grain boundary (to have a quadrupoint), it is presumed that another grain boundary starts thereat.

Then, each object with, a line shape as illustrated in FIG. 2 is recognized. The positions of such objects are then stored in the memory of the CPU 81.

For each of the line objects, the film thickness thereof at three points along the length of the object (normally the middle and both ends) are measured automatically (step 63(b)) by means of the EELS detector 74. A point corresponding to a concavity in the film thickness distribution, as shown in FIG. 2 (a part where the film thickness on the line is minimized) is automatically selected. corresponds, in the manual operation, to operation by the operator to reduce the beam diameter by adjusting the electron beam diameter control knob 76 in FIG. 7, to shift the electron beam in the X and Y directions by adjusting electron beam shifting knobs 78, 79, and to discriminate by comparison of film thicknesses measured by the EELS detector 74. The objects for which the shape is linear and the film thickness is concave are thus determined.

Element analysis is carried out (step 63(c)) using the EDX detector 75 at three points on the linear object (again, normally at the middle and both ends) for each object for which the shape is linear and the film thickness is concave. The element distribution corresponding to "convex" in FIG. 2 is selected from the intensity distribution states on the basis of the element concentration. This corresponds in manual operation to carrying out element analysis with the EDX detector by adjusting the electron beam diameter control knob 76 and the electron beam shifting knobs 79, 80 in the same manner as in the film thickness measurement, and comparing respective concentrations.

As the result these measurements, the objects which correspond to a grain boundary as defined by the code 1-2-3 in FIG. 2 are identified (step 64 in FIG. 6). The positions of these objects may then be displayed on the, display 12.

It will be appreciated from FIG. 2 that some objects can be identified on the basis of shape only or on the basis of only two of the parameters of shape, film thickness change, and element change. Thus, for some objects, it is not necessary to carry out all three types of analysis (steps 63(a) to steps 63(c) in FIG. 6). The type or types of analysis may be selected automatically in accordance with the object specified by the operator.

An automatic adjustment method for enabling to evaluation of the precise concentration distribution of phosphorus will now be described. Based on the result of recognition as described below, an object having a minimum line width, a film thickness in the vicinity of 100 $\mu$m with a smoothest plane and the largest change in element concentration along the line thereof may be selected, and moved automatically to the center of the view field of the electron microscope. This corresponds in the manual operation by the operator to selecting a grain boundary considered the most likely from his/her experience in consideration of the analytical results of the film thicknesses and the element concentrations, then moving that object to the center of the electron microscope manually.

The tilting of a specimen in order to make the grain boundary plane thereof parallel to the incident direction of the electron beam will now be described. Suppose that the result of preliminary measurement is that, in FIG. 3, $\theta = 52$ degrees, $t = 110$ nm, and $\delta = 2.9$ nm. Then using the equations $\alpha = \cos\theta \cdot \arctan(\delta/t)$, $\beta = \sin\theta \cdot \arctan(\delta/t)$, the plane can be rotated around the x and y axes by 0.93 and 1.12 degrees, respectively. Suppose that the result was $\delta = 60$ nm. A similar calculation is then made and the plane is rotated around the x and y axes by 0.19 and 0.25 degrees respectively. As the result, $\delta$ is increased to 0.8 nm which is greater than the initial value. Therefore, the sample B returned to the original position and then width of the grain boundary is assumed to be $\delta = 0.6$ nm. This operation to make the grain boundary plane parallel to the direction of incidence of the electron beam corresponds, in the manual operation, to the operation by the operator to adjust the sample by manipulating rotation angle control pedals 85, 86 in FIG. 7 for rotating the sample around the X and Y axes. This requires the operator to use his experience so as to minimize the width of the grain boundary.

If the width (e.g. 0.6 nm) of this grain boundary is smaller than the minimum diameter (1.0 nm) of the electron beam, the minimum beam diameter is selected (i.e. 1.0 nm ). Thus the measuring position is also automatically set to be 0.0 nm, $\pm 1.0$ nm, $\pm 2.0$ nm, $\pm 3.0$ nm, $\pm 5.0$ nm, $\pm 7.0$ nm, $\pm 10.0$ nm. The time needed for entering data into an EDX per point is set e.g. to 100 s.

Thus, as shown in FIG. 5, the adjustment step 53 is carried out until adjustment is satisfactory, and then a sample is analyzed and evaluated at step 54. FIG. 6 shows that the step 54 may be broken down into steps 65(a), 65(b), 65(c), 65(d), 65(e) and 65(f), and an additional correction step 66 may also be carried out. Once the object has been identified, and the results investigated ( step 67 in FIG. 6 ), the analysis of the object is complete.

When the measurement of a point (object) is completed, the diameter of the electron beam is automatically enlarged, and observation is carried out to verify the position of the specimen and to make suitable correction, then the beam is moved moving to the next point to be measured.

Thus, as shown in FIGS. 5 and 6, the operation may return to the adjustment step 53 before further investigation of the next point. When all points have been investigated, the operation stops (step 55).

Figure 9:
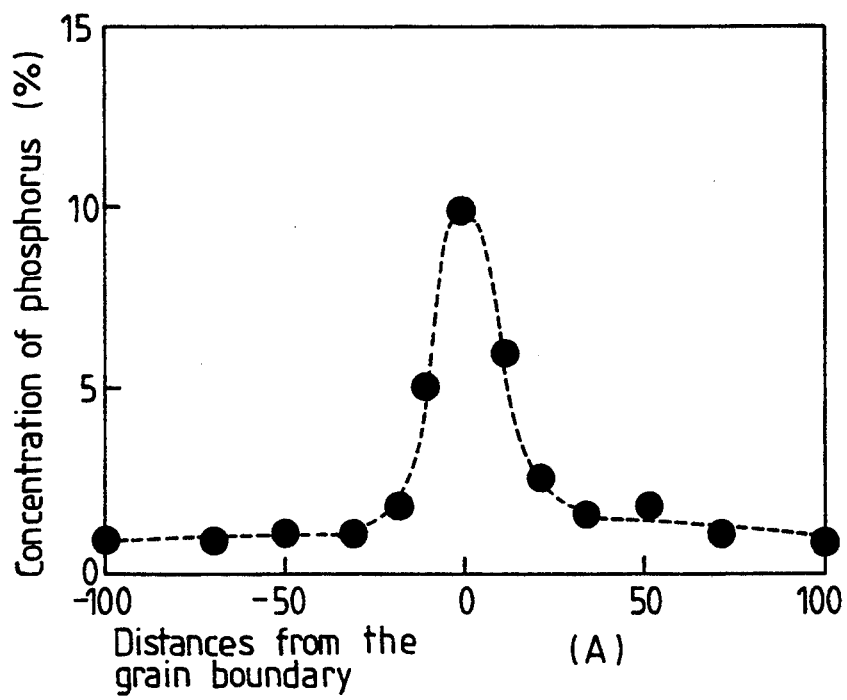
FIG. 9 is a Graph showing an example of the concentration distribution of phosphorous adjacent a grain boundary in a specimen.

FIG. 9 illustrates an example of the concentration distribution of phosphorus obtained according to this embodiment of the invention. Phosphorus has segregated in the grain boundary, the value of which is approximately 10.

Embodiment 2

Figure 10:
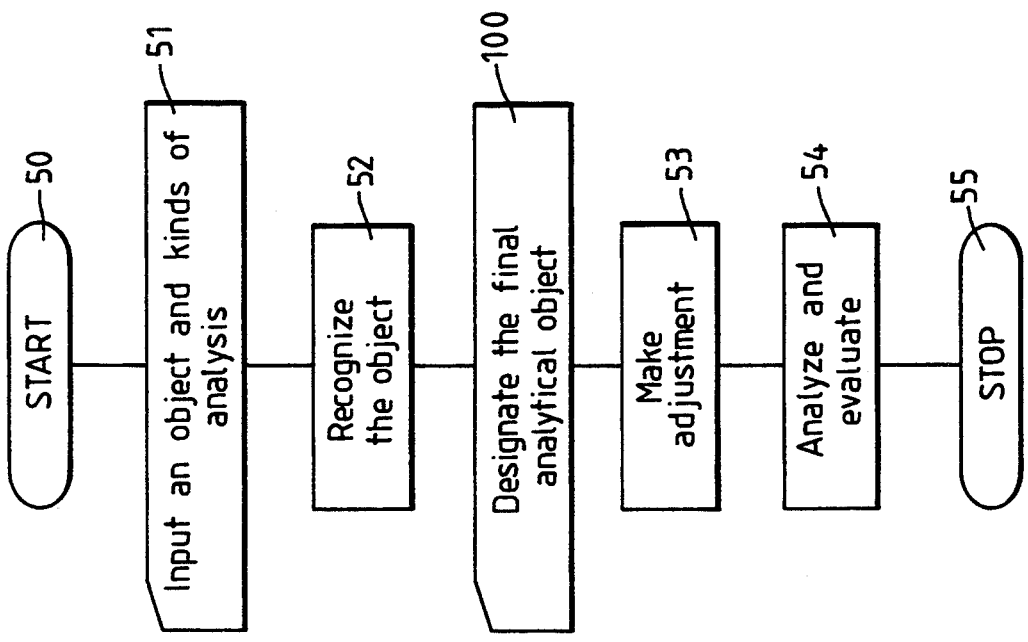
FIG. 10 is a flowchart showing the basic steps of a method of operating an analytical electron microscope according to a second embodiment of the present invention.

As shown in the flowchart of FIG. 10, the steps 50 to 52 of a second embodiment of the invention are the same as the steps of FIG. 5, up to the recognition of an object ( step 52 ). However, the second embodiment proposes that the objects recognized are stored in the memory of the CPU 81 such that the operator can designate on the display 82 a final object he wishes to analyze from those displayed.

After the object to be measured has been instructed by the operator from the terminal 70, that object is automatically shifted to the central position in the electron microscope. Adjustment, such as tilting the specimen and analyzing the specimens in the steps that follow (steps 53 to 55) are the same as in the first embodiment.

Embodiment 3

The third embodiment of the invention is similar to the first two embodiments except that prior to entering the step of shape recognition, a rough measurement of film thickness distribution is made over the whole area of the specimen. Using, an EELS detector, the film thickness distribution is measured, then the CPU 81 controls the electron microscope to select a region having a film thickness from 5.0 nm to 250 nm. The specimen to be measured in this embodiment has a hole having a diameter of approximately 120 $\mu$m in the center portion thereof and an outer periphery of this hole having a width of about 170 $\mu$m corresponds to the film thickness region. Thus, the shape recognition is carried out limited to this region. This operation may then be done in a short period of time, e.g. about 3 minutes.

Embodiment 4

The fourth embodiment of the invention is intended to simplify the recognition operation by means of suitable software. For example, in the case of "grain boundary" analysis, a "dislocation" cannot be discriminated simply from analyses of "shape" and "film thickness", as can be seen from FIG. 2. Hence, it is also necessary to carry out element analysis. However, when it is known that no dislocations exist, the grain boundary can be determined by "shape" and "film thickness" alone.

In practice, in order to facilitate recognition of objects by means of the analytical electron microscope, carried out after the entry by the operator of a selection of a type of an object and analytical evaluation items according to the first embodiment of the invention, suitable software may be stored for asking a question to the operator "Is dislocation present?". When no dislocation is present, and the operator responds accordingly, the analytical electron microscope automatically carries out measurements only of the shape and film thickness and yet is able to recognize the grain boundary of an object. As the result, the time required in carrying out the element analysis of FIG. 3 can be eliminated.

Embodiment 5

Figure 11:
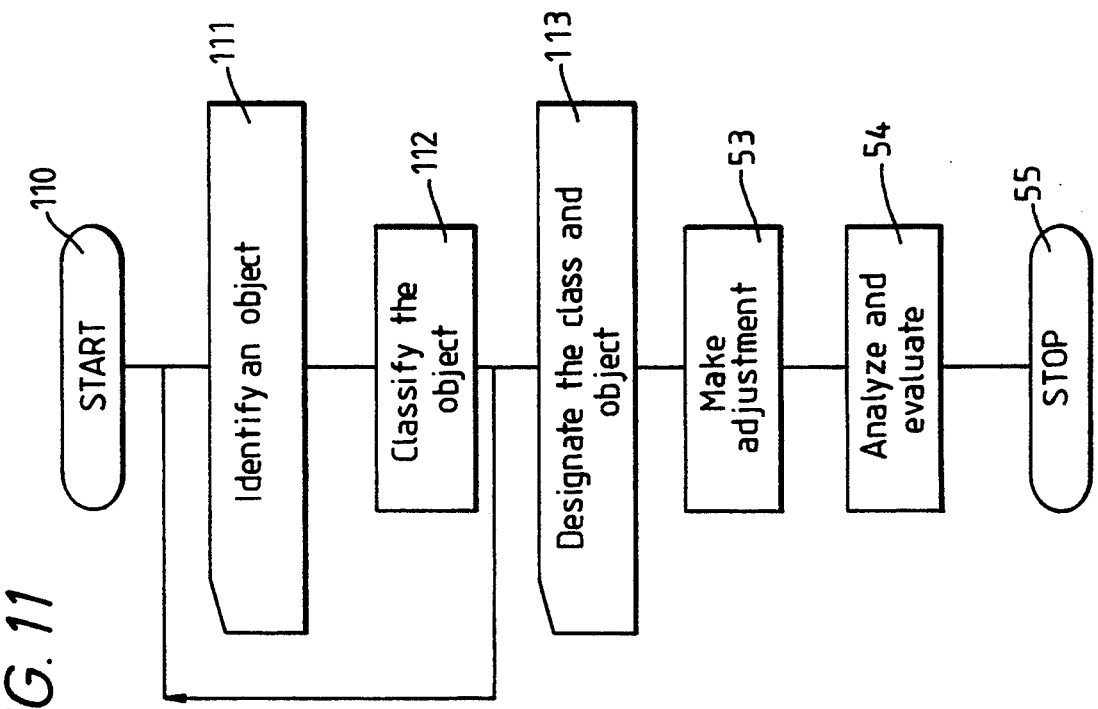
FIG. 11 is a flowchart showing the basic steps of a method of operating an analytical electron microscope according to another embodiment of the present invention.

In the first four embodiments discussed above, the operator specifies the type of object to be investigated, and the kinds of analysis to be carried out on that object. It is also possible, within the present invention, for the electron microscope automatically to scan the sample to identify and classify the types of objects present. Thus, as shown in FIG. 11, the processing is started (step 110), and the electron microscope then identifies a first object at step 111. That object is then analyzed using the classification codes shown in FIG. 2 to classify the object into one of the types of objects listed in FIG. 2 (step 112). Steps 111 and 112 are then repeated for each object. The result is that the object present in the sample are classified according to their type. At step 113, the operator can then designate the class (type) and possibly a specific object within that class. The electron microscope then carries out adjustment and analysis (steps 53 and 54) as in the first embodiment. With this embodiment, if only one class (type) of object is present, then the operator does not need to designate the class at step 113.

According to the present invention, an analytical electron microscope may be almost completely automated. As a result, even those who are not skilled in the art may readily carry out high precision analysis. In addition, the time needed for analysis has been substantially shortened.

What is claimed is

1. An analytical electron microscope, comprising:
means for specifying a desired object of a sample to be detected by said analytical electron microscope;
means for generating an electron beam and for causing said electron beam to be incident on the sample;
means for detecting the effect of said sample on said electron beam thereby to detect detected objects in said sample; and
analysis means for identifying automatically at least one of:
i) object shape
ii) change of thickness
iii) change of element for each of said detected objects, and for determining which of said detected objects corresponds to said desired object on the basis of the automatic identification.

2. An analytical electron microscope according to claim 1, also including means for varying the orientation of said sample relative to said beam.

3. An analytical electron microscope according to claim 1, also including means for varying the position of said sample relative to said beam.

4. An analytical electron microscope according to claim 1 including means for varying automatically the magnification of said electron microscope in dependence on said desired object.

5. An analytical electron microscope according to claim 1, including means for varying automatically the size of said electron beam in dependence on said desired object.

6. An analytical electron microscope according to claim 1 including means for varying automatically the position of said electron beam relative to the sample in dependence on said desired object.

7. An analytical electron microscope according to claim 1, wherein said means for detecting the effect of said sample on said electron beam includes an energy dispersive type X-ray analyzer.

8. An analytical electron microscope according to claim 1, wherein said means for detecting the effect of said sample on said electron beam includes an electron energy loss spectrometer.

9. An analytical electron microscope, comprising:
means for generating an electron beam and for causing the electron beam to be incident on a sample in said analytical electron microscope;
means for detecting the effect of the sample on the electron beam, thereby to detect detected objects in said sample; and
analysis means for carrying out automatic determination of:
i) object shape,
ii) change of thickness, and
iii) change of element for each of said detected objects and for classifying said detected objects into a plurality of classes on the basis of said automatic determination.

10. An analytical electron microscope, comprising:
means for generating a electron beam and for causing said electron beam to be incident on a sample;
means for detecting the effect of said sample on said electron beam, thereby to detect at least one detected object in said sample; and
analysis means for carrying out automatic determination of:
i) object shape,
ii) change of thickness, and
iii) change of element for said at least one detected object, and for identifying said at least one detected object on the basis of said automatic determination.

11. An analytical electron microscope, comprising:
means for specifying a desired object of a sample to be detected;
means for detecting detected objects in said sample on the basis of the interaction of an electron beam of said analytical electron microscope with said sample
first analysis means for identifying automatically which of said detected objects corresponds to said desired object; and second analysis means for automatically investigating at least one of said detected objects which corresponds to said desired object.

12. An analytical electron microscope according to claim 11, further including means for varying the orientation of said sample relative to said electron beam, said means for varying the orientation being controllable by said second analysis means.

13. An analytical electron microscope according to claim 11, further including means for varying the position of said sample relative to said beam, said means for varying the position being controllable by said second analysis means.

14. An analytical electron microscope according to claim 11, further including means for varying automatically the magnification of said electron microscope in dependence on said desired object, said means for varying the magnification being controllable by said second analysis means.

15. An analytical electron microscope according to claim 11, further including means for varying automatically the size of said electron beam in dependence on said desired object.

16. An analytical electron microscope, comprising:
means for generating an electron beam and for causing the electron beam to be incident on a sample; in said analytical detection microscope;
means for detecting the effect of the sample on the electron beam, thereby to detect detected objects in said sample;
first analysis means for automatically classifying each of said detected objects into one of a plurality of classes; and
second analysis means for automatically investigating at least one of said detected objects of at least one of said plurality of classes.

17. A method of operating an electron microscope, comprising:
specifying a desired object of a sample to be detected by said analytical electron microscope;
causing an electron beam of said electron microscope to be incident on said sample;
detecting the effect of said sample on said electron beam, and thereby detecting detected objects in said sample;
identifying automatically at least one of:
i) object shape
ii) change of thickness
iii) change of element for each of said detected objects, and
determining which of said detected objects corresponds to said desired object on the basis of the automatic identification.

18. A method according to claim 17, further including varying the orientation of said sample relative to said beam such that at least one of said detected object which corresponds to said desired object has a predetermined orientation relative to said electron beam.

19. A method according to claim 18, wherein said desired object is a grain boundary plane of said sample, said grain boundary plane is oriented parallel to the direction of incidence of the electron beam on said sample, and the grain boundary plane is then rotated about at least one axis through an angle equal to $\cos\theta$. arctan $(\delta/t)$ where $\theta$ is the angle made by the grain boundary plane and the crystal x-y plane of the sample, $\delta$ is the appropriate grain boundary width and t is the film thickness.

20. A method according to claim 17, further including varying the position of said sample relative to said beam and such that at least one of said detected objects which corresponds to said desired object has a predetermined position relative to said electron beam.

21. A method according to claim 17, further including varying automatically the magnification of said electron microscope in dependence on said desired object.

22. A method according to claim 17, further including varying automatically the size of said electron beam in dependence on said desired object.

23. A method of operating an electron microscope comprising:
causing an electron beam of said electron microscope to be incident on said sample;
detecting the effect of said sample on said electron beam, and thereby detecting detected objects in said sample;
carrying out automatic determination of:
i) object shape,
ii) change of thickness, and
iii) change of element for each of said detected objects; and
classifying said detected objects into a plurality of classes on the basis of said automatic determination.

24. A method of operating an electron microscope, comprising:
causing an electron beam of said electron microscope to be incident on said sample;
detecting the effect of said sample on said electron beam, and thereby detecting detected objects in said sample;
carrying out automatic determination of:
i) object shape,
ii) change of thickness, and
iii) change of element for said at least one detected object; and
identifying said at least one detected object on the basis of said automatic determination.

25. A method of operating an analytical electron microscope, comprising:
specifying a desired object of a sample to be detected;
detecting detected objects in said sample on the basis of the interaction of an electron beam of said analytical electron microscope with said sample;
identifying automatically which of said detected objects corresponds to said desired object; and
automatically investigating at least one of said detected objects which corresponds to said desired object.

26. A method of operating an analytical electron microscope, comprising:
causing an electron beam of said analytical electron microscope to be incident on a sample;
detecting detected objects in said sample on the basis of the interaction of an electron beam of said analytical electron microscope with said sample;
identifying automatically which of said detected objects corresponds to a desired object; and
automatically investigating at least one of said detected objects which corresponds to said desired object.

* * * * *